(12) United States Patent
Kimura

(10) Patent No.: US 6,476,500 B2
(45) Date of Patent: Nov. 5, 2002

(54) SEMICONDUCTOR DEVICE

(75) Inventor: Naoto Kimura, Kumamoto (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/909,051

(22) Filed: Jul. 19, 2001

(65) Prior Publication Data

US 2002/0011654 A1 Jan. 31, 2002

(30) Foreign Application Priority Data

Jul. 25, 2000 (JP) ........................................ 2000-224437

(51) Int. Cl.[7] .......................... H01L 23/48; H01L 23/52; H01L 23/40
(52) U.S. Cl. ...................... 257/777; 257/686; 257/738; 361/760; 438/108; 438/109
(58) Field of Search ................................ 257/777, 778, 257/738, 686; 361/760; 438/108, 109

(56) References Cited

U.S. PATENT DOCUMENTS 6,001,671 A * 12/1999 Fjelstad ...................... 438/112
6,014,586 A * 1/2000 Weinberg et al. ............. 607/36
6,133,626 A * 10/2000 Hawke et al. ............... 257/686
6,208,018 B1 * 3/2001 Ma et al. .................... 257/669
6,215,182 B1 * 4/2001 Ozawa et al. ............... 257/723

FOREIGN PATENT DOCUMENTS

JP 01028856 A * 1/1989
JP 06224369 A * 8/1994

* cited by examiner

Primary Examiner—Eddie Lee
Assistant Examiner—Chris C. Chu

(57) ABSTRACT

A first semiconductor chip is mounted on a printed circuit board and a second semiconductor chip is mounted on said first semiconductor chip. The second semiconductor chip is displaced in a special direction from the center of the first semiconductor chip. This obviates the need for relay terminals on the side of the first semiconductor chip toward which the second semiconductor chip has been displaced. This allows the first semiconductor chip to be reduced in size by the area that would otherwise be occupied by the relay terminals, and thereby reduces the size of the semiconductor device.

12 Claims, 3 Drawing Sheets

SEMICONDUCTOR DEVICE

BACKGROUND OF THE INVENTION

1. Field of the Invention

The present invention relates to a semiconductor device and more specifically to a stack-type semiconductor device with a plurality of semiconductor chips stacked on top of each other.

2. Description of the Related Art

In recent years, smaller semiconductor devices have been required in keeping with the current trend towards a reduction in the size of the housing of products such as mobile telephones. A package that is the same size as the semiconductor chip has been developed to fit in such a small housing. Incidentally, a semiconductor device of this type was referred to as a CSP (Chip Size Package). On the other hand, a semiconductor device has been suggested that has a stacked package structure in which a plurality of semiconductor chips are stacked on top of each other to provide storage capacity and a number of electronic circuit functions.

FIG. 1 is a cross sectional view illustrating an example of a prior art semiconductor device, and FIG. 2 is a plan view illustrating a first semiconductor chip for use in the prior art semiconductor device. For example, as shown in FIG. 1, such a semiconductor device, reduced in size and provided with multi-functions, is composed of a second semiconductor chip 21 and a first semiconductor chip 22. The semiconductor chip 21 has a plurality of electrode pads 24 arranged side by side along opposite sides of the upper surface thereof. The semiconductor chip 22 has a plurality of electrode pads 27 and relay terminals 25 arranged side by side along opposite sides. The second semiconductor chip 21 is designed to be mounted on top of the first semiconductor chip 22 and fixed in place with an adhesive.

In addition, the first semiconductor chip 22, on top of which the second semiconductor chip 21 is mounted, is mounted on an insulating printed circuit board 23 and fixed with an adhesive. This structure requires long wires, or long thin metal wires, to connect the conductive pads 26 and the electrode pads 24 electrically. An increase in the length of the wires would present a problem with respect to contact with the semiconductor chips or other wires.

In this regard, the relay terminals 25 are provided in addition to the ordinary electrode pads 27 on top of the first semiconductor chip 22. Wires 29 connect between the conductive pads 26 and the relay terminals 25, and wires 28 connect between the relay terminals 25 and the electrode pads 24. In this way the conductive pads 26 and the electrode pads 24 are connected.

Incidentally, external wiring terminals 31 are connected to a trace layer 30 of the insulating printed circuit board 23 and adapted to protrude through the lower surface of the insulating printed circuit board 23. The external wiring terminals 31 are connected to the conductive pads 26 of the printed circuit board 23 within the housing. The trace layer 30 and the conductive pads 26 are connected to each other through via-holes 33. In addition, the space of the mold, including the wires 28 and 29 and the first semiconductor chip 22 and the second semiconductor chip 21, is filled with a resin to form a resin body 32. This is done to prevent the entry of moisture from the outside and to protect against external mechanical forces. As described above, the prior art semiconductor device is characterized by being the same size as the insulating printed circuit board 23 that is slightly greater in size than the first semiconductor chip 22. In this way the size of the semiconductor device is reduced.

However, since the aforementioned semiconductor device has the elongated relay terminals 25 on opposite sides of the first semiconductor chip 22, the first semiconductor chip 22 cannot be reduced in size. In other words, because it is not possible to reduce the size of the first semiconductor chip 22 it is impossible to reduce the size of the insulating printed circuit board 23. Consequently, a further reduction in the size of the semiconductor device becomes a problem.

Also, suppose that the first semiconductor chip 22 is a storage element. In this case such a semiconductor chip, which is larger in capacity and size than is necessary, would have to be used to provide the relay terminals 25. Consequently, there is a further problem in that the semiconductor device becomes expensive.

SUMMARY OF THE INVENTION

It is therefore an object of the present invention to provide a semiconductor device that is reduced in size and cost.

A semiconductor device according to the present invention comprises a printed circuit board having a plurality of electrically conductive pads on an upper surface thereof. A first semiconductor chip is mounted on said printed circuit board. A second semiconductor chip is mounted on said first semiconductor chip so as to be displaced in a special direction from the center of said first semiconductor chip. Said second semiconductor chip has a length in said special direction smaller than said first semiconductor chip. A first area of said first semiconductor chip which is not covered by said second semiconductor chip in said special direction is smaller than a second area of said first semiconductor chip which is not covered by said second semiconductor chip in a direction contrary to said special direction. First electrode pads are arranged along both sides of said first semiconductor chip on said first area and said second area, in which said both sides of said first semiconductor chip are apart from each other in said special direction. Second electrode pads are arranged along both sides of said second semiconductor chip, in which said both sides of said second semiconductor chip are apart from each other in said special direction. A plurality of relay terminals are arranged along a side on said second area of said first semiconductor chip. First metal wires connect said first electrode pads and said electrically conductive pads and second metal wires connect said electrically conductive pads and said second electrode pads which are arranged along a side of said second semiconductor chip in said special direction. Third metal wires connect said electrically conductive pads and said relay terminals and fourth metal wires connect said relay terminals and said second electrode pads which are arranged along a side of said second semiconductor chip in a direction contrary to said special direction. External terminals protrudes from a lower surface of said printed circuit board and are connected to said electrically conductive pads. Said electrically conductive pads are arranged corresponding to said first electrode pads and said second electrode pads.

In addition, it is preferable that the relay terminals and the first electrode pads are formed side by side. The relay terminals are preferably formed in the shape of an elongated rectangle.

On the other hand, the first, second, third and fourth thin metal wires are preferably formed of gold (Au). Furthermore, the external wiring terminals are preferably made of a solder material formed in the shape of a sphere.

As described above, the present invention provides the following effects. The second semiconductor chip is mounted on the first semiconductor chip and it is displaced in a special direction from the center of the first semiconductor chip. As a result, the need for relay terminals on the side of the first semiconductor chip, toward which the second semiconductor chip has been displaced, is obviated. This allows the first semiconductor chip to be reduced in size by the area that would otherwise be occupied by the relay terminals, and thereby reduces the size of the semiconductor device.

The present invention obviates the need for a semiconductor chip that has an unnecessarily large storage capacity to be used as the first semiconductor chip. As a result, a less expensive semiconductor chip with a suitable capacity can be used. Thus, the present invention also provides a semiconductor device at lower cost.

DETAILED DESCRIPTION OF THE PREFERRED EMBODIMENT

Now, a semiconductor device according to an embodiment of the present invention will be explained in more detail with reference to the accompanying drawings.

Figure 3A:
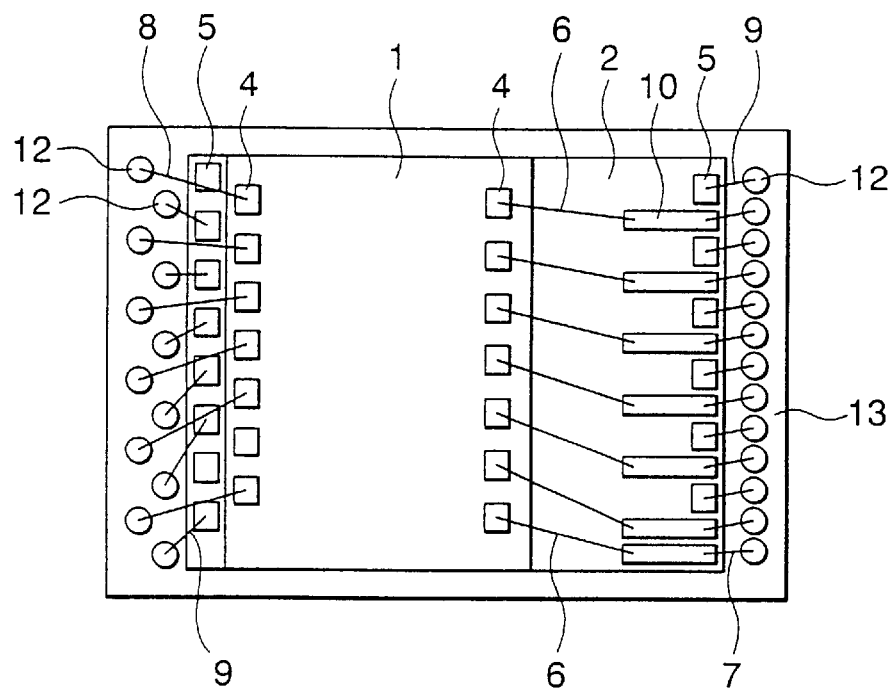
FIG. 3A is a plan view illustrating a semiconductor device according to an embodiment of the present invention.
Figure 3B:
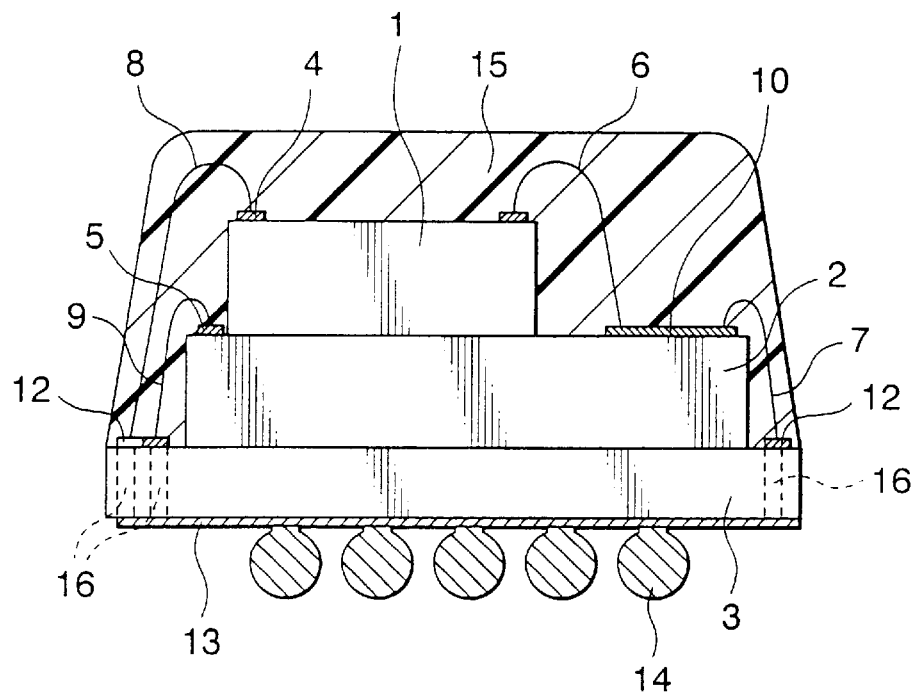
FIG. 3B is a cross sectional view illustrating the semiconductor device according to the embodiment of the present invention.
Figure 3C:
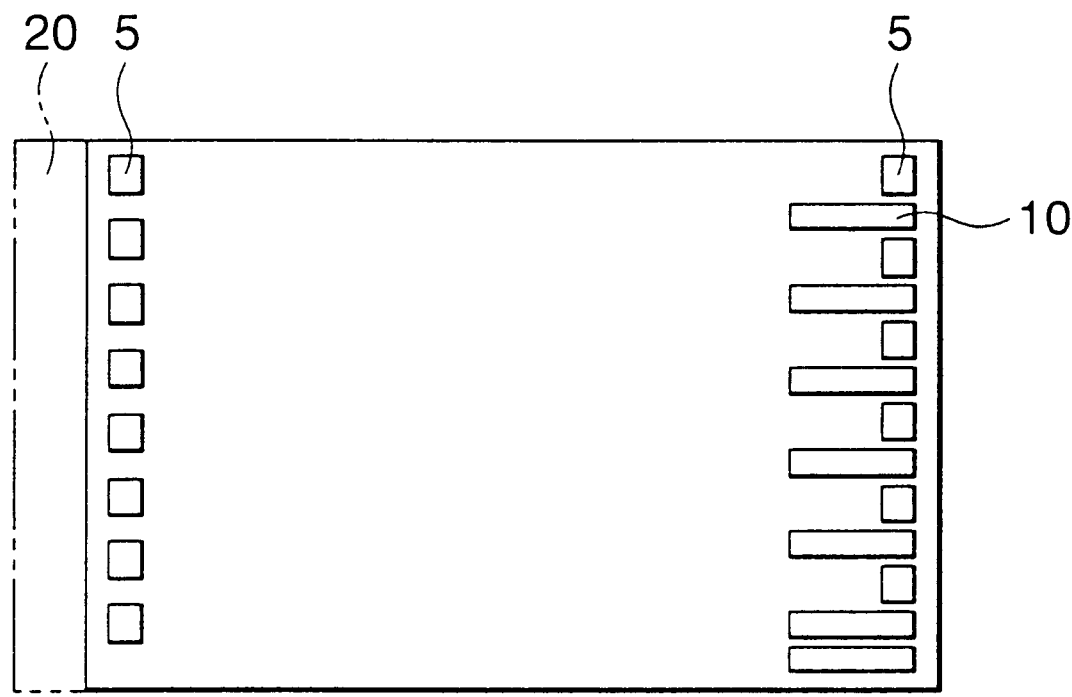
FIG. 3C is a plan view illustrating the first semiconductor chip according to the embodiment.

FIG. 3A is a plan view illustrating a semiconductor device according to the embodiment of the present invention, FIG. 3B is a cross sectional view illustrating the semiconductor device according to the embodiment of the present invention, and FIG. 3C is a plan view illustrating the first semiconductor chip according to the embodiment. As shown in FIGS. 3A and 3B, this semiconductor device includes a first semiconductor chip 2 that is mounted on an insulating printed circuit board 3 with a plurality of electrically conductive pads 12. In addition, a second semiconductor chip 1 is mounted on the upper surface of the first semiconductor chip 2 via an adhesive and displaced in a special direction from the center of the first semiconductor chip 2. On the upper surface of the second semiconductor chip 1, a plurality of electrode pads 4 are arranged side by side in lines along both sides which are apart from each other in said special direction. Electrode pads 5 are arranged in lines along both sides apart from each other in said special direction of the upper surface of the first semiconductor chip 2. In addition, relay terminals 10, the same in number as the electrode pads 4 on the side in a direction opposite to said special direction, are interposed between the electrode pads 5 on the wider upper surface of the first semiconductor chip 2. On both edges of the insulating printed circuit board 3, the conductive pads 12, which are the same in number as the electrode pads 4 and 5 and the relay terminals 10, are arranged. Thin metal wires 8 connect the electrode pads 4 of the second semiconductor chip 1 and the conductive pads 12 of the insulating printed circuit board 3. Wires 9 connect the electrode pads 2 of the first semiconductor chip 2 and the conductive pads 12 of the insulating printed circuit board 3. In addition, the conductive pads 12 are connected to a trace layer 13 formed on the lower surface of the insulating printed Circuit board 3 through via holes 16. The trace layer 13 is connected with external wiring terminals 14, which are adapted to protrude through the lower surface of the insulating printed circuit board 3.

Furthermore, wires 7 connect the conductive pads 12 and the relay terminals 10, and wires 6 connect the relay terminals 10 and the electrode pads 4. In this way the electrode pads 4 and the conductive pads 12 are connected.

On the other hand, the wires on the side toward which the second semiconductor chip 1 has been displaced can be formed without touching the wires 8, 9 and the semiconductor chip. This is because the conductive pads 12 are close to the electrode pads 4 and 5. The wires 8 connect the conductive pads 12 and the electrode pads 4. The wires 9 connect the conductive pads 12 and the electrode pads 5. Therefore, this structure obviates the need for relay terminals for a direct connection between the electrode pads 4 and the conductive pads 12. This makes it possible to reduce the size of the first semiconductor chip 2 because of the reasons described later.

Incidentally, the relay terminals 10 are preferably formed in the shape of elongated rectangles. This is because the first semiconductor chip 2 and the electrode pads 5 are formed simultaneously. This is to simplify the shape of the reticle pattern to be used in the exposure equipment for forming the electrode pads 5 and the relay terminals 10. Furthermore, it is preferable that the relay terminals 10 are aligned with the ends of the electrode pads 5 along the edge of the first semiconductor chip 2 and that the other ends are disposed close to the second semiconductor chip 1. Furthermore, it is preferable that the other ends of the relay terminals 10 are extended in a manner such that the distance between the other ends of the relay terminals 10 and the electrode pads 4 is equal to that between the conductive pads 12 and the electrode pads 5.

The insulating printed circuit board 3 may be formed of ceramic or glass epoxy on which wirings are printed. In this embodiment, an inexpensive printed circuit board formed of glass epoxy was employed. In addition, an epoxy resin adhesive was employed for bonding the first semiconductor chip 2 and the second semiconductor chip 1 together. Furthermore, since low-voltage signals are used, it is preferable to employ Au wires as thin metal wires or the wires 6,7,8, and 9 with a low electrical resistance.

Furthermore, it is preferable that a resin body 15 for enveloping the wires 6, 7, 8 and 9 is adapted so that the lower part is formed in the same shape as that of the insulating printed circuit board 3. The resin body 15 should also have a tapered upper part with rounded corners. In addition, low bumps should not be used to attach the external wiring terminals 14 to the insulating printed circuit board 3. It is preferable that high solder balls, formed in advance in the shape of spheres, are used to attach the external wiring terminals 14 to the insulating printed circuit board 3 using a solder ball mounting jig.

Figure 1:
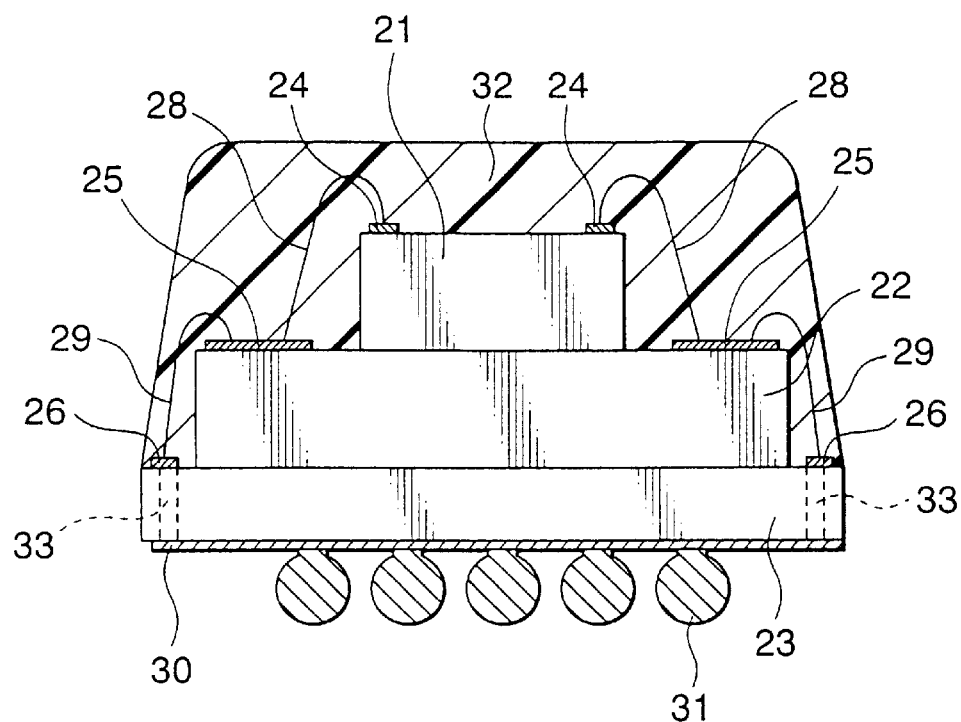
FIG. 1 is a cross sectional view illustrating an example of a prior art semiconductor device.
Figure 2:
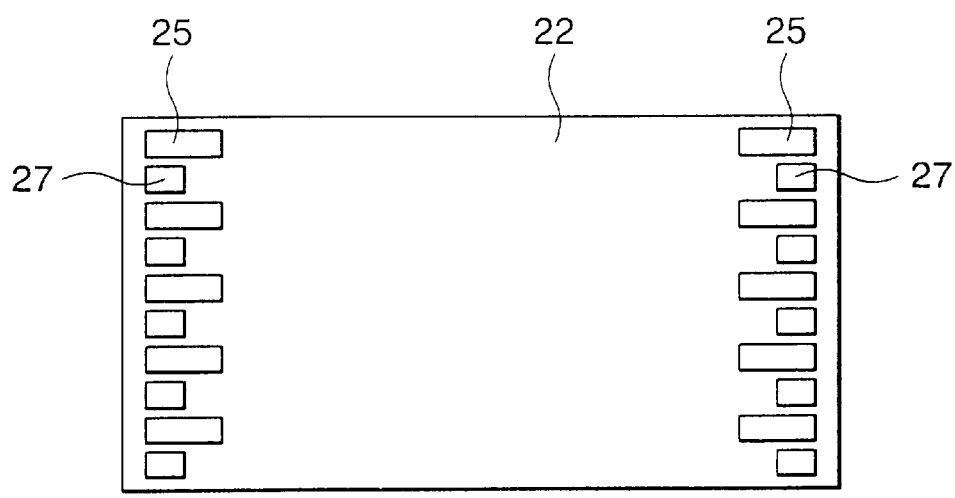
FIG. 2 is a plan view illustrating a first semiconductor chip of a prior art semiconductor device.

As described above, as shown in FIG. 2, the relay terminals 25 of the first semiconductor chip 22 were necessary in the prior art. However, as shown in FIG. 3c, the second semiconductor chip 1 is displaced toward either side of the first semiconductor chip 2 thereby obviating the need for the relay terminals 25. This makes it possible to reduce the size of the first semiconductor chip 2 by the same amount as the reduction in size of area 20 that would otherwise be occupied by the relay terminals in the shape of an elongated rectangle.

What is claimed is:

1. A semiconductor device comprising:
   a printed circuit board having a plurality of electrically conductive pads on an upper surface thereof;
   a first semiconductor chip mounted on said printed circuit board;
   a second semiconductor chip mounted on said first semiconductor chip so as to be displaced in a perpendicular direction from a centerline of said first semiconductor chip, said second semiconductor chip having a length in said perpendicular direction smaller than said first semiconductor chip, and a first area of said first semiconductor chip which is not covered by said second semiconductor chip in said perpendicular direction being smaller than a second area of said first semiconductor chip which is not covered by said second semiconductor chip in a direction contrary to said perpendicular direction;
   first electrode pads arranged along both sides of said first semiconductor chip on said first area and said second area, said both sides of said first semiconductor chip being apart from each other in said perpendicular direction;
   second electrode pads arranged along both sides of said second semiconductor chip, said both sides of said second semiconductor chip being apart from each other in said perpendicular direction;
   a plurality of relay terminals arranged along a side on said second area of said first semiconductor chip;
   first metal wires connecting said first electrode pads and said electrically conductive pads;
   second metal wires connecting said electrically conductive pads and said second electrode pads which are arranged along a side of said second semiconductor chip in said perpendicular direction;
   third metal wires connecting said electrically conductive pads and said relay terminals;
   fourth metal wires connecting said relay terminals and said second electrode pads which are arranged along a side of said second semiconductor chip in a direction contrary to said special direction; and
   external terminals, protruding from a lower surface of said printed circuit board and connected to said electrically conductive pads,
   wherein said electrically conductive pads are arranged corresponding to said first electrode pads and said second electrode pads and wherein no relay terminals are arranged along a side on said first area of said first semiconductor chip.

2. The semiconductor device according to claim 1, wherein said relay terminals and said first electrode pads are formed side by side.

3. The semiconductor device according to claim 2, wherein said relay terminals are formed in the shape of an elongated rectangle.

4. The semiconductor device according to claim 1, wherein said first metal wires, said second metal wires, said third metal wires, and said fourth metal wires are gold (Au) wires.

5. The semiconductor device according to claim 2, wherein said first metal wires, said second metal wires, said third metal wires, and said fourth metal wires are gold (Au) wires.

6. The semiconductor device according to claim 3, wherein said first metal wires, said second metal wires, said third metal wires, and said fourth metal wires are gold (Au) wires.

7. The semiconductor device according to claim 1, wherein
   said external terminals are a solder material formed in the shape of a sphere.

8. The semiconductor device according to claim 2, wherein
   said external terminals are a solder material formed in the shape of a sphere.

9. The semiconductor device according to claim 3, wherein
   said external terminals are a solder material formed in the shape of a sphere.

10. The semiconductor device according to claim 4, wherein
    said external terminals are a solder material formed in the shape of a sphere.

11. The semiconductor device according to claim 5, wherein
    said external terminals are a solder material formed in the shape of a sphere.

12. The semiconductor device according to claim 6, wherein
    said external terminals are a solder material formed in the shape of a sphere.

* * * * *